(12) United States Patent
Pan et al.

(10) Patent No.: US 7,341,680 B2
(45) Date of Patent: Mar. 11, 2008

(54) PRINTABLE COMPOSITION WITH NANOSTRUCTURES OF FIRST AND SECOND TYPES

(75) Inventors: Alfred I-Tsung Pan, Sunnyvale, CA (US); Scott T. Haubrich, Albuquerque, NM (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 184 days.

(21) Appl. No.: 11/070,657

(22) Filed: Mar. 2, 2005

(65) Prior Publication Data

US 2006/0197064 A1 Sep. 7, 2006

(51) Int. Cl.
*H01B 1/00* (2006.01)
*H01B 1/02* (2006.01)
*B32B 5/16* (2006.01)

(52) U.S. Cl. ............... 252/500; 428/402; 252/514

(58) Field of Classification Search ........... 252/500, 252/514; 428/402
See application file for complete search history.

(56) References Cited

U.S. PATENT DOCUMENTS

| | | | | |
|---|---|---|---|---|
| 4,960,462 | A | * | 10/1990 | Mueller et al. ............. 75/252 |
| 5,171,480 | A | * | 12/1992 | Yoshinaka et al. ...... 252/519.32 |
| 5,180,523 | A | * | 1/1993 | Durand et al. ............. 252/512 |
| 5,286,415 | A | * | 2/1994 | Buckley et al. ............ 252/502 |
| 5,951,918 | A | * | 9/1999 | Kuwajima et al. .......... 174/257 |
| 6,808,972 | B2 | | 10/2004 | Sirringhaus et al. |
| 6,833,181 | B2 | * | 12/2004 | Matsumora ............... 428/221 |
| 7,068,898 | B2 | * | 6/2006 | Buretea et al. ............. 385/123 |
| 2002/0083858 | A1 | | 7/2002 | MacDiarmid et al. |
| 2003/0059987 | A1 | | 3/2003 | Sirringhaus et al. |
| 2003/0060038 | A1 | | 3/2003 | Sirringhaus et al. |
| 2003/0151028 | A1 | * | 8/2003 | Lawrence et al. .......... 252/500 |
| 2004/0235227 | A1 | | 11/2004 | Kawase |
| 2005/0026317 | A1 | | 2/2005 | Sirringhaus et al. |

FOREIGN PATENT DOCUMENTS

WO    WO 97/15935    *    5/1997

OTHER PUBLICATIONS

Wang, et. al., "Maskless Lithography Using Drop-On-Demand Inkjet Printing Method," Proc. SPIE vol. 5374, pp. 628-636 (2004).
Bao, et. al., "Printable Organic and Polymeric Semiconducting Materials and Devices," J. Mater. Chem. 9, 1895-1904 (1999).
Ridley, et. al., "All-Inorganic Field Effect Transistors Fabricated By Printing," Science, vol. 286, pp. 746-749 (Oct. 22, 1999).
Chung, et. al., "Conductor Microstructures By Laser Curing of Printed Gold Nanoparticle Ink," App. Phys. Lett., vol. 84, No. 5, pp. 801-803 (Feb. 2, 2004).
Das, Raghu, "Printed Electronics White Paper: Technology Overview and Applications," IDTechEx Limited, pp. 1-4 (2004).
O'Connor, "Making Inks for Printable Tags," RFID Journal, 4-page printout from www.rfidjournal.com/article/articleview/1072/1/1/ (Aug. 3, 2004).

* cited by examiner

*Primary Examiner*—Douglas McGinty
*Assistant Examiner*—Jaison Thomas

(57) ABSTRACT

A printable composition for use in forming a printed element by printing and curing is described. The printable composition comprises a plurality of nanostructures of a first type that, upon printing and curing, form an arrangement defining intermediate volumes thereamong. The printable composition further comprises a plurality of nanostructures of a second type that, upon printing and curing, at least partially fill the intermediate volumes to promote smooth surface topography and reduced porosity in the printed element.

23 Claims, 4 Drawing Sheets

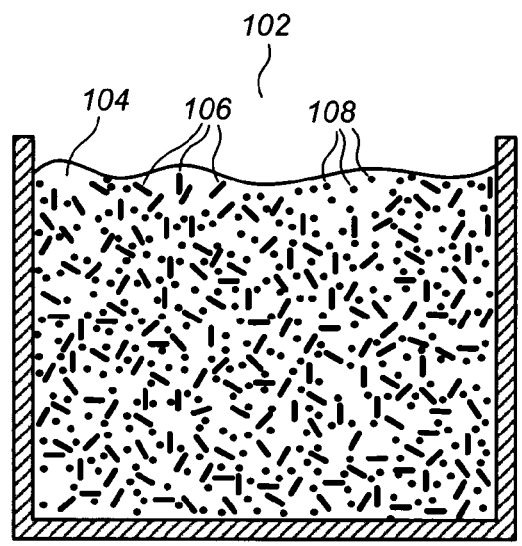
FIG. 1
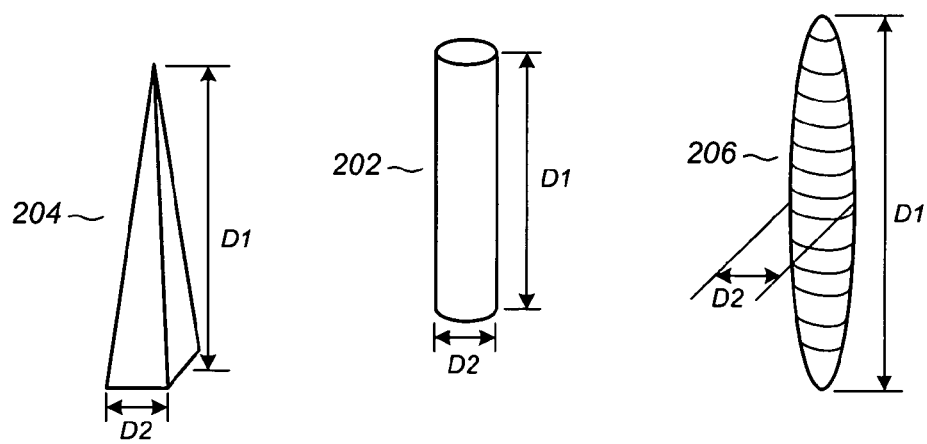
FIG. 2
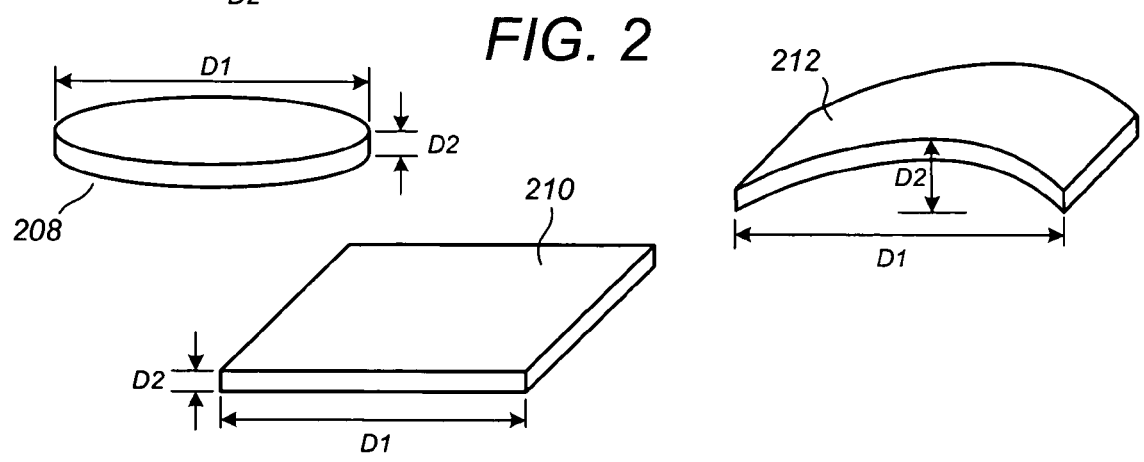

US 7,341,680 B2

PRINTABLE COMPOSITION WITH NANOSTRUCTURES OF FIRST AND SECOND TYPES

FIELD

This patent specification relates to printable compositions having nanostructural ingredients and the printing of functional materials therewith.

BACKGROUND

The field of printed electronics, and more generally the field of printed functional materials, represents a promising avenue toward a new world of devices ranging from flexible, low-cost computer displays to lightweight, high-capacity storage batteries. Using printing technologies traditionally associated with the creation of human-readable text or graphics, special printable compositions or "inks" are transferred to surfaces and cured into functional elements such as conductors, semiconductors, and dielectrics. Multilayer structures can be built in an additive process, i.e., by printing additional layers of elements on top of previously-cured elements, to create more complex structures such as thin-film transistors.

Although several advantages can be brought about in terms of device flexibility, cost, durability, and the like, the electrical performance offered by today's printed semiconductors is generally inferior to the performance of single-crystal semiconductors used in most of today's high-speed electronics and computing equipment. Whereas single-crystal silicon semiconductors may offer mobilities in the range of 800-1000 $cm^2/V$-s, which can facilitate device switching speeds in the MHz and GHz range, printed semiconductor elements such as pentacene, a p-type organic semiconductor, may only offer mobilities on the order of 2-3 $cm^2/V$-s.

One issue can arise in the fabrication of functional printed elements when the printable composition contains nanostructures intended to impart certain characteristics to the cured printed element, such as certain electrical characteristics (e.g., conductive, semiconductive, dielectric, etc.). Upon thermal treatment or other curing method, and due at least in part to a volume shrinkage of a molecular precursor accompanying the nanostructures in the printable composition, the morphology of the resulting printed element can be porous, and the surface of the resulting printed element can be rough. This, in turn, can bring about difficulty in properly printing a subsequent layer on top of the printed element. It would be desirable to provide for reduced porosity and smoother surface topography in the printed element.

SUMMARY

In accordance with an embodiment, a printable composition for use in forming a printed element is provided. The printable composition comprises a plurality of nanostructures of a first type that, upon printing and curing, form an arrangement defining intermediate volumes thereamong. The printable composition further comprises a plurality of nanostructures of a second type that, upon printing and curing, at least partially fill the intermediate volumes to promote smooth surface topography and reduced porosity in the printed element.

Also provided is a method for fabricating a printed element, in which a composition is transferred onto a surface according to a printing process and cured to form the printed element. The composition comprises a plurality of nanostructures of a first type and a plurality of nanostructures of a second type, the nanostructures of the second type at least partially filling space between the nanostructures of the first type in the printed element.

Also provided is a printed circuit element comprising a plurality of nanostructures of a first type in an arrangement defining intermediate volumes thereamong, and a plurality of nanostructures of a second type at least partially filling the intermediate volumes. The printed circuit element is formed by a transfer of an ink solution comprising the nanostructures of the first and second types to a surface according to a printing process and by a curing of the transferred ink solution.

Also provided is an ink formulation for a printer, comprising a first percentage by weight of elongate nanostructures having an aspect ratio above about 3:1, and a second percentage by weight of compact nanostructures having an aspect ratio below about 2:1. The second percentage is between about 0.2 and 100 times the first percentage.

Also provided is an apparatus comprising means for transferring a printable composition to a surface, the printable composition comprising a plurality of nanostructures of a first type that, upon transfer to a surface and curing, form an arrangement defining intermediate volumes thereamong. The printable composition further comprises a plurality of nanostructures of a second type that, upon transfer to the surface and curing, at least partially fill the intermediate volumes to promote smooth surface topography and reduced porosity in the resultant printed element.

BRIEF DESCRIPTION OF THE DRAWINGS

FIG. 1 illustrates a printable composition according to an embodiment;

FIG. 2 illustrates examples of elongate nanostructures according to one or more embodiments;

DETAILED DESCRIPTION

Figure 3:
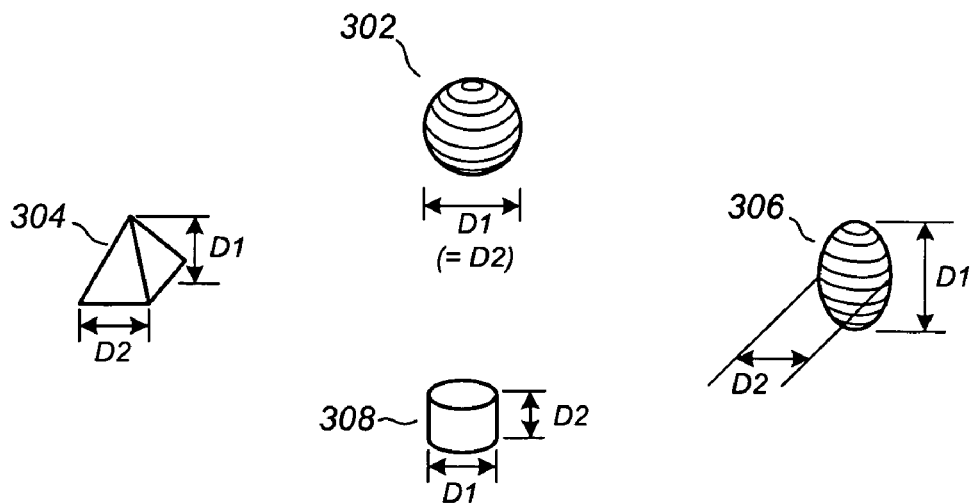
FIG. 3 illustrates examples of compact nanostructures according to one or more embodiments.

FIG. 1 illustrates a printable composition 102 according to an embodiment, comprising a carrier solution 104, a plurality of nanostructures of a first type, and a plurality of nanostructures of a second type. By way of non-limiting example, the nanostructures of the first type can be similar to elongate nanostructures 106, while the nanostructures of the second type can be similar to compact nanostructures 108. However, other types of nanostructures can be used in other embodiments. Printable composition 102 further comprises a molecular precursor substantially dissolved in the carrier solution 104, the molecular precursor being selected such that it decomposes into a desired solid material upon transfer and curing. In one embodiment, the molecular precursor is selected such that the decomposed precursor solid comprises amorphous or polycrystalline versions of the material used for the elongate nanostructures 106. In another embodiment, the molecular precursor is selected such that, upon transfer to a surface in conjunction with the carrier solution 104, a saturation condition occurs that facilitates in situ growth of crystalline or polycrystalline versions of the elongate nanostructural material.

FIG. 2 illustrates examples 202-212 of elongate nanostructures 106 that may be used in the printable composition 102 of FIG. 1. The elongate nanostructures 106 may comprise nanowires, nanorods, nanodiscs, nanoplates, or any of a variety of other anisometric nanostructures having major dimensions D1 that are substantially greater than their minor dimensions D2, as illustrated in FIG. 2. Depending on the particular application, the elongate nanostructures 106 can comprise conductive, a semiconductive, or dielectric material. Other examples can include phosphorus. In one embodiment, the elongate nanostructures 106 have an aspect ratio (the ratio of their major dimension D1 to their minor dimension D2) that is greater than 3:1. In another embodiment, the elongate nanostructures 106 have an aspect ratio that is greater than 5:1.

It is to be appreciated that FIG. 2 illustrates only a few examples of the many types of elongate nanostructures that may be used in accordance with the present teachings. Moreover, different shapes of elongate nanostructures can be mixed together without departing from the scope of the present teachings. For example, half of the elongate nanostructures 106 may comprise nanowires similar to element 202 of FIG. 2, while the other half may comprise nanodiscs similar to element 208 of FIG. 2. Although the particular elements 202-212 illustrated in FIG. 2 are solid throughout, in other embodiments the elongate nanostructures 106 can comprise hollow nanocylinders or other shapes that are not solid throughout.

FIG. 3 illustrates examples 302-308 of compact nanostructures 108 that may be used in the printable composition 102 of FIG. 1. The compact nanostructures 108 may comprise any of a variety of compact shapes in which a major dimension D1 is generally comparable to a minor dimension D2. For example, the compact nanostructures 108 may be generally globular, as illustrated by the spheroid shape 302 or the ellipsoid shape 306 in FIG. 3. Alternatively, the compact nanostructures 108 may comprise truncated nanowires 308 as illustrated in FIG. 3, or other shapes such as the pyramidal shape 304. In one embodiment, the compact nanostructures 108 have an aspect ratio that is less than 3:1. In another embodiment, the compact nanostructures 108 have an aspect ratio that is less than 2:1.

The compact nanostructures 108 can comprise conductive, semiconductive, or dielectric material. Other examples can include phosphorus. In one embodiment, the compact nanostructures 108 comprise a material identical to the material used for elongate nanostructures 106, while in other embodiments, the materials can be different. As with the elongate nanostructures 106, the compact nanostructures 108 can be mixed and matched from among different shapes, e.g., half of the compact nanostructures can be similar to the spheroid shape 302 of FIG. 3, while the other half can be similar to the truncated nanowire shape 308 of FIG. 3. As with the elongate nanostructures 106, the compact nanostructures 108 can comprise shapes that are solid throughout, or that are not solid throughout.

Figure 4:
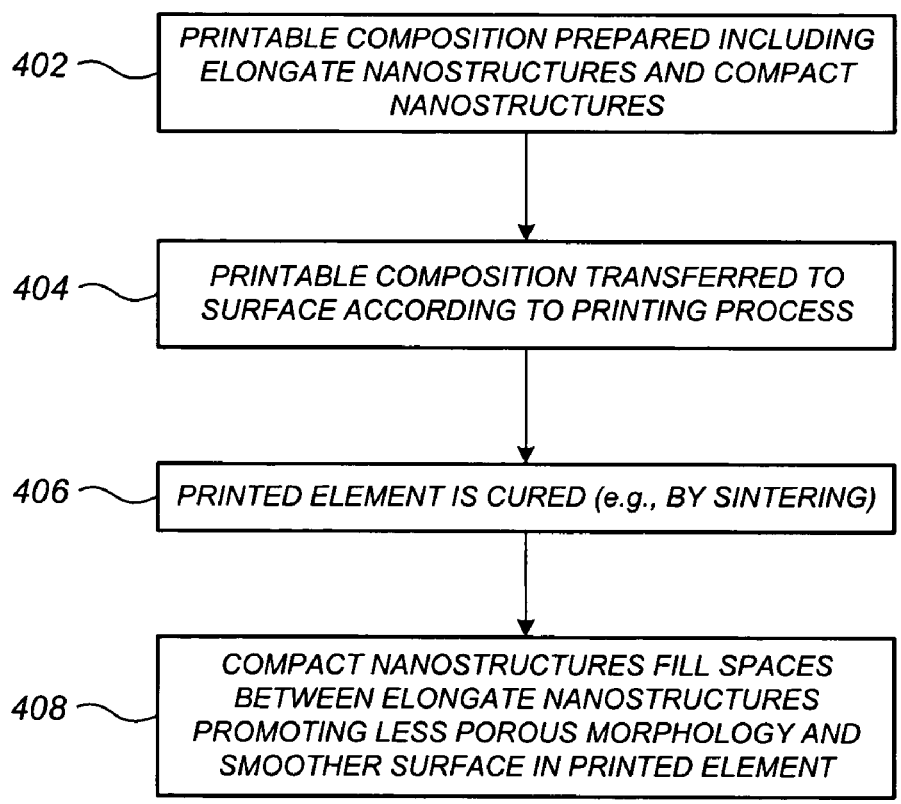
FIG. 4 illustrates fabricating a printed element according to an embodiment.

FIG. 4 illustrates fabricating a printed element according to an embodiment. At step 402, the printable composition 102 is prepared including elongate nanostructures 106 and compact nanostructures 108. At step 404, the printable composition 102 is transferred to a surface according to a printing process.

Figure 5:
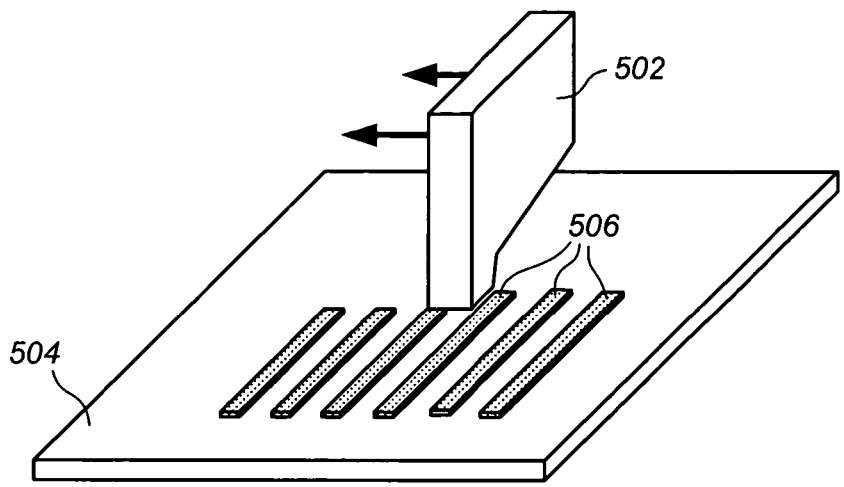
FIG. 5 illustrates a surface upon which a printable composition is being transferred by an inkjet printer according to an embodiment.

FIG. 5 illustrates a surface 504 to which a printable composition is being transferred according to an inkjet printing process. An inkjet printhead 502 containing the ink, i.e., the printable composition 102, is swept across the surface 504 in a manner analogous to the way black or colored ink is deposited on paper by a commercially available inkjet printer, such that printed elements 506 are formed. The example of FIG. 5 simply shows the printed elements 506 as being parallel straight lines, it being appreciated that specific layouts are programmed into the printer drivers for the inkjet printing apparatus to form various circuit elements such as electrical conductors, resistors, capacitor plates, capacitor dielectrics, transistor sources/gates/drains, etc. Any of a wide variety of printing processes can be used at step 404 including, but not limited to, inkjet printing, drop-on-demand printing, screen printing, microcontact printing, gravure printing, flexography printing, letterpress printing, and electrostatic printing.

At step 406, the printed elements 506 are cured, such as by a sintering process. In one embodiment, the sintering temperature is low enough such that the elongate and compact nanostructures are not melted, but high enough such that the liquid content in the printable composition will evaporate and the molecular precursor will decompose into the desired solid material. At step 408, upon curing, the compact nanostructures 108 fill spaces between the elongate nanostructures 106 to promote less porous morphology and smoother surface topography in the printed elements 506. Subsequent layers of printed elements can then be applied as needed to form the desired functional device.

Figure 6:
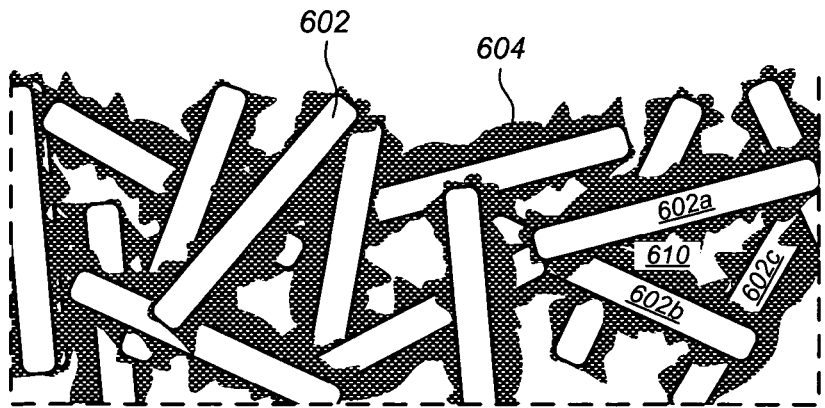
FIG. 6 illustrates transferred and cured printable composition having elongate nanostructures but not having compact nanostructures.

FIG. 6 illustrates, for purposes of clarity and comparison, a hypothetical cross-section of a printed element near a surface thereof for a circumstance in which elongate nanostructures 602 are present in the printable composition but compact nanostructures are not present. The elongate nanostructures 602 form a haystack-like arrangement, with decomposed molecular precursor 604 also being present and acting as a kind of physical and electrical "glue" for proximal elongate nanostructures 602. Intermediate regions lying among the elongate nanostructures 602, as represented by the intermediate region 610 lying among the elongate nanostructures 602a, 602b, and 602c, can be substantially unoccupied, being only partially filled with material such as the decomposed molecular precursor 604. As illustrated, the morphology of the printed element can be porous, and the surface can be rough. Notably, depending on the particular substances and environments of the printing process, the elongate nanostructures could alternatively become arranged in a parallel fashion. However, even in this case the printed element can have substantial porosity and/or surface roughness.

Figure 7:
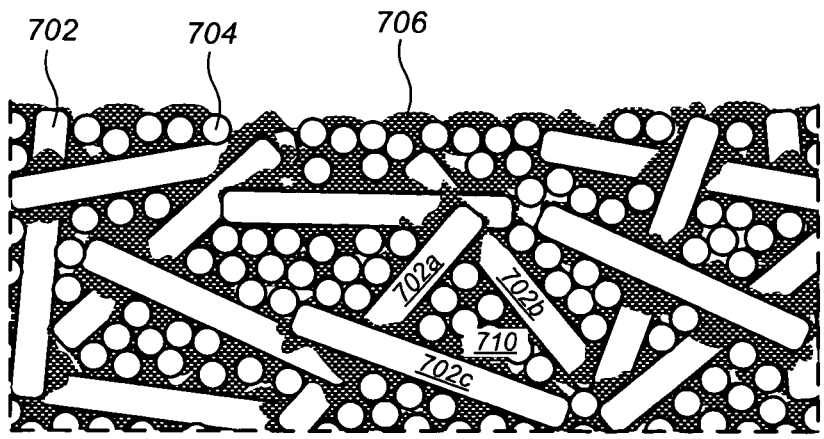
FIG. 7 illustrates transferred and cured printable composition according to an embodiment.

FIG. 7 illustrates, for purposes of clarity and comparison, a hypothetical cross-section of a printed element near a surface thereof for a circumstance in which both compact nanostructures 704 and elongate nanostructures 702 are present in the printable composition according to an embodiment. The elongate nanostructures 702 form a generally random arrangement that defines intermediate volumes thereamong, as represented by the intermediate volume 710 positioned among the elongate nanostructures 702a, 702b, and 702c. As illustrated, the presence of the compact nanostructures 704 in the intermediate volumes 710 promotes reduced porosity and a smoother surface in the resultant printed element. Moreover, the electrical properties of the printed element can be substantially enhanced, because electrical connectedness of the elongate nanostructures 702 is also promoted. The present teachings are also applicable where the elongate nanostructures become arranged in a parallel fashion, the compact nanostructures promoting smoother surfaces and reduced porosity in that arrangement as well.

In one particularly advantageous embodiment, the elongate nanostructures 702 and the compact nanostructures 704 each comprise an identical semiconducting material, and the resultant printed element is a semiconducting element having a carrier mobility substantially improved by the presence of the compact nanostructures in the intermediate volumes 710. In another particularly advantageous embodiment, the elongate nanostructures 702 and the compact nanostructures 704 each comprise an identical conductor, and the resultant printed element is a conductor with a conductance that is substantially improved by the presence of the compact nanostructures in the intermediate volumes 710.

Various details relating to the above description, FIGS. 1-7, and the present teachings are presented hereinbelow, but should not be construed as limiting the scope of the present teachings. In one embodiment, the elongate nanostructures are nanorods having a length of roughly 200 nm and a diameter of roughly 10 nm. In other embodiments, the elongate nanostructures may be substantially thinner or thicker, having a minor dimension (i.e., diameter) between 2 nm and 100 nm, for example. Upon transfer and cure without the compact nanostructures of the present teachings, the nanorods would form a generally random arrangement similar to that of FIG. 6. Some degree of electrical connectivity among the nanorods could be achieved solely by virtue of this haystack-like arrangement, and the overall printed element could achieve some degree of electrical utility. However, in accordance with an embodiment, compact nanostructures having a generally globular shape are included in the printable composition. The resulting printed element, also referred to as a thin film, enjoys reduced porosity, smoother topography, and a high degree of physical and electrical connectedness to yield improved overall physical and electrical performance. In one example, which is presented by way of example and not by way of limitation, the compact nanostructures are roughly spherical (D1=D2) and have a diameter of 7 nm where the elongate nanostructures are nanorods having a length of roughly 200 nm and a diameter of roughly 10 nm.

In one embodiment, a major dimension of the compact nanostructures is less than a minor dimension of the elongate nanostructures, as with the preceding example. In other embodiments, a major dimension of the compact nanostructures can be comparable to a minor dimension of the elongate nanostructures. In still other embodiments, a major dimension of the compact nanostructures can be substantially greater than a minor dimension of the elongate nanostructures, provided that the compact nanostructures are small enough to populate the intermediate volumes among the elongate nanostructures in the cured printed element in a manner that facilitates smooth surface topography and reduced porosity.

Elongate and compact nanostructures that may be used in accordance with the present teachings may be fabricated in any of a variety of ways. For example, single crystal nanowires may be grown using methods such as vapor-liquid-solid (VLS) catalytic growth, solution-liquid-solid (SLS) catalytic growth, and non-catalytic vapor-phase epitaxy. Other methods for producing nanowires include template-assisted synthesis, nanoimprint lithography, dip-pen nanolithography, self-assembly of nanoparticles, solution phase methods based on capping reagents, and solvothermal methods.

In one embodiment in which the elongate nanostructures are nanorods 200 nm in length and 10 nm in diameter, and in which the compact nanostructures are approximately 7 nm globes, the printable composition comprises 2.0% by weight of the nanorods and 3.0% by weight of the compact nanostructures. The ratio by weight of compact nanostructures to elongate nanostructures in the printable composition can generally range between about 0.2 to 100 without departing from the scope of the present teachings. The appropriate ratio by weight of compact nanostructures to elongate nanostructures for a particular circumstance will be highly dependent on the particular sizes and contours of the elongate nanostructures, which affects how tightly or loosely they will arrange, and also on the particular sizes and shapes of the compact nanostructures, which will affect how efficiently they can fill the intermediate volumes among the elongate nanostructures. Where the elongate nanostructures are straight nanowires and the compact nanostructures are globular, a ratio by weight of compact nanostructures to elongate nanostructures between about 0.5 to 2 often provides for good morphology and smooth surface topography.

A wide range of viscosities for the printable composition are within the scope of the present teachings. In some embodiments, the printable composition comprises a highly non-viscous solution in which the solid content (primarily the elongate and compact nanostructures) is relatively low, e.g. 3 percent or less. In other embodiments, the printable composition can comprise a highly viscous solution, even approaching 90 percent. In some embodiments, the printable composition can have a relatively low viscosity on the order of 10-20 centipoise, while in other embodiments the printable composition can have a relatively high viscosity on the order of 200 centipoise or greater.

Among other advantages according to the present teachings, desirable electrical characteristics such as high conductivity and high mobility can be achieved without requiring a melting or liquid-phase fusing of the nanostructural material during the curing/sintering process. This provides an ability to cure/sinter at relatively low temperatures, including "plastic-friendly" temperatures, thereby widening the choice of available substrates (surfaces) and the variety of devices that can be fabricated.

In the particular context of semiconducting devices, while certain known organic printed semiconductors might be cured at relatively low temperatures, such organic semiconductors generally suffer from relatively low carrier mobilities, as in the pentacene example supra. When implemented in the context of inorganic semiconductor materials, the present teachings can provide for the higher-mobilities associated with inorganic semiconductors, while at the same time providing for relatively low curing/sintering temperatures including "plastic-friendly" temperatures. In one embodiment, the sintering temperature using a printable composition containing inorganic semiconductors according to the present teachings can be about 500 degrees Celsius or less, while the resultant printed element can have carrier mobilities greater than about 10 $cm^2/V$-s. In some embodiments, the resultant printed element can have carrier mobilities greater than about 1 $cm^2/V$-s. Yet another advantage according to the present teachings is reduced shrinkage of the printed element during the sintering process, which can thereby reduce lateral and vertical stresses on device components during and after the curing process.

Where a conducting printed element is desired, examples of conducting materials for the elongate and compact nanostructures include gold, silver, platinum, or other highly conductive metals. Where a dielectric printed element is desired, examples of (non-air) dielectric materials for the elongate and compact nanostructures include $Ta_2O_5$, $SiO_2$, and $Al_2O_3$. Where a semiconducting printed element is desired, examples of semiconducting materials for the elongate and compact nanostructures include ZnO, CdS, CdSe, ZnS, PbS, GaAs, InP, InO, InSnO, and InZnO. The semiconducting materials can be pre-doped for negative or positive carriers, i.e., the p-doping or n-doping can be performed in conjunction with the fabrication of the elongate and/or compact nanostructures prior to formation of the printable composition.

For a nanostructure material of ZnO in which the elongate nanostructures are 2.0 percent by weight of the printable composition and the compact nanostructures are 3.0 percent by weight of the printable composition, one suitable molecular precursor comprises zinc 2-ethylhexanoate (1.0 percent of the printable composition by weight) and 2-ethylhexanoic acid (0.2 percent of the printable composition by weight). In this embodiment, the carrier solution can comprise isopropanol (93.8 percent of the printable composition by weight).

More generally, the carrier solution can comprise solvent, surfactants and/or other additives that will further aid in film formation and good film morphology. By way of example and not by way of limitation, the carrier solution can comprise solvents such as water or isopropanol with or without a surfactant or other additives to assist with suspension and/or distribution of the suspended nanostructures. The surfactant can serve as a wetting agent and/or an encapsulation agent for the nanostructures in the carrier solution. In some embodiments, ionic surfactants are used that have either water soluble or hydrophilic functional groups. Examples of anionic surfactants that can be used include, but are not limited to, sodium dodecylsulfate (SDS), sodium deoxycholate (DOC), and N-lauroylsarcosine sodium salt. Examples of cationic surfactants that can be used include, but are not limited to, lauryldimethylamine oxide (LDAO), cetyltrimethylammonium bromide (CTAB), and bis(2-ethlyhexyl)sulfosuccinate sodium salt. Any of the above sodium salts may alternatively be a lithium salt or a potassium salt.

In some embodiments, the carrier solution can comprise pH modifiers. Examples of pH modifiers for the above-described example include bases, such as sodium hydroxide (NaOH), potassium hydroxide (KOH), ammonia ($NH_3$), and methaneamine ($CH_3NH_2$), and acids, such as hydrochloric acid (HCl), sulfuric acid ($H_2SO_4$), and acetic acid ($CH_3COOH$). Certain buffers also may be employed as pH modifiers.

For a nanostructure material of ZnO, the molecular precursor can comprise one or more of ZnO, $Zn(NO_3)_2$, $ZnSO_4$, $ZnCl_2$, and $Zn(C_2H_3O_2)_2$ within an aqueous carrier solution. For a nanostructure material of CdS, the molecular precursor can comprise one or more of cadmium citrate, cadmium chloride, and thioreau. For a nanostructure material of CdSe, the molecular precursor can comprise one or more of cadmium citrate and N,N-dimithyl-selenourea. For a nanostructure material of ZnS, the molecular precursor can comprise one or more of $ZnSO_4$ and $SC(NH_2)_2$. For a nanostructure material of PbS, the molecular precursor can comprise one or more of $Pb(NO_3)$ and $SC(NH_2)_2$.

Figure 8:
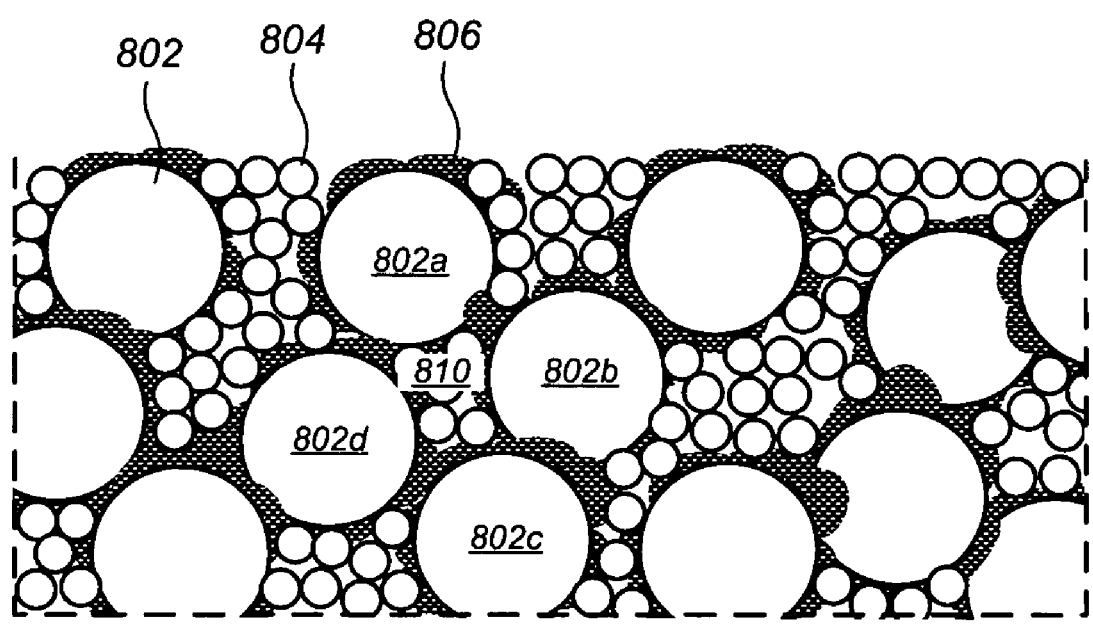
FIG. 8 illustrates transferred and cured printable composition according to an embodiment.

FIG. 8 illustrates a hypothetical cross-section of a printed element near a surface thereof where a printable composition is transferred and cured according to an embodiment, the printable composition comprising a plurality of nanostructures of a first type in an arrangement defining intermediate volumes thereamong, the printable composition further comprising a plurality of nanostructures of a second type at least partially filling the intermediate volumes. By way of example, the nanostructures of the first type can be similar to the larger nanostructures 802 of FIG. 8, while the nanostructures of the second type can be similar to the smaller nanostructures 804. It is to be appreciated that while the larger nanostructures 802 and smaller nanostructures 804 of FIG. 8 are shown to be spherical, in other embodiments they can be pyramidal, cubical, or otherwise comprising multi-sided volumes. It still other embodiments, they can be elliptical or otherwise oddly-shaped. The larger nanostructures 802 form an arrangement that defines intermediate volumes thereamong, as represented by the intermediate volume 810 positioned among the larger nanostructures 802a, 802b, 802c, and 802d. Decomposed molecular precursor 806 further fills part of the intermediate volumes 810. As illustrated, the presence of the smaller nanostructures 804 in the intermediate volumes 810 promotes reduced porosity and a smoother surface in the resultant printed element. Moreover, the electrical properties of the printed element can be substantially enhanced, because electrical connectedness of the larger nanostructures 802 is also promoted. While the larger nanostructures 802 are shown in FIG. 8 as forming a generally random arrangement, in other embodiments they can become arranged in a more regular fashion, the smaller nanostructures 804 promoting smoother surfaces and reduced porosity in that arrangement as well.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, although some embodiments supra are described as having all of the elongate nanostructures made from the same material (i.e., all conducting, all semiconducting, all dielectric), it is not outside the scope of the present teachings to mix conducting and semiconducting elongate nanostructures, or to mix conducting and dielectric elongate nanostructures, and so on, depending on the particular resultant electrical properties desired. Likewise, the compact nanostructures can comprise mixtures of conducting, semiconducting, and dielectric materials without departing from the scope of the present teachings.

By way of further example, although some embodiments supra are described in terms of the elongate nanostructures being randomly oriented in the cured printed element, in other embodiments the elongate nanostructures can be uniformly or quasi-uniformly oriented without departing from the scope of the present teachings. By way of still further example, while certain embodiments supra are particularly advantageous when the nanostructures are inorganic semiconductors and the molecular precursor is configured to decompose into amorphous or polycrystalline versions of that inorganic material, one or more of the elongate nanostructures, compact nanostructures, molecular precursors, carrier solution, and decomposed molecular precursors can comprise organic semiconductor compounds or other organic compounds without departing from the scope of the present teachings.

By way of still further example, while the molecular precursor supra is described as decomposing into amorphous or polycrystalline structures, often of the same material as the nanostructures, the molecular precursor could alternatively form epitaxially grown single-crystal extensions of the nanostructure crystals, or otherwise form epitaxially grown single-crystal versions of the nanostructural material or other material, without departing from the scope of the present teachings. By way of even further example, although one or more embodiments supra is particularly advantageous where the elongate nanostructures form a generally random arrangement upon printing and curing, in other preferred embodiments the elongate nanostructures form a generally ordered arrangement, e.g., generally parallel to each other, with the compact nanostructures occupying space between the elongate nanostructures for reducing porosity and/or surface smoothness in the cured printed element. Thus, reference to the details of the described embodiments are not intended to limit their scope.

What is claimed is:

1. A printable composition for use in forming a printed element by printing and curing, comprising: a plurality of nanostructures of a first type that, upon said printing and curing, form an arrangement defining intermediate volumes thereamong, wherein the plurality of nanostructures of the first type comprise elongate nanostructures comprising a crystalline version of a compound; a plurality of nanostructures of a second type, wherein said plurality of nanostructures of a second type are compact nanostructures that, upon said printing and curing, at least partially fill said intermediate volumes to promote smooth surface topography and reduced porosity in the printed element; a carrier solution, wherein said plurality of nanostructures of a first type and the plurality of nanostructures of a second type are suspended in said carrier solution; and a molecular precursor substantially dissolved in said carrier solution, said molecular precursor forming into a solid material interspersed with said plurality of nanostructures of a first type and said plurality of nanostructures of a second type upon said printing and curing, wherein the molecular precursor facilitates in situ growth of crystalline or polycrystalline versions of the elongate nanostructure material upon transfer to a surface in conjunction with said carrier solution.

2. The printable composition of claim 1, wherein said elongate nanostructures generally have aspect ratios greater than 3:1, and wherein said compact nanostructures generally have aspect ratios less than 2:1.

3. The printable composition of claim 2, wherein said elongate nanostructures generally have aspect ratios greater than 5:1, and wherein said compact nanostructures are generally globular with a major dimension less than a minor dimension of said elongate nanostructures.

4. The printable composition of claim 3, wherein said minor dimension of said elongate nanostructures is between about 2 nm and 100 nm.

5. The printable composition of claim 1, wherein said nanostructures of the first type comprise one of a metal and a semiconductor, and wherein said nanostructures of the second type are identical in composition to said nanostructures of the first type.

6. The printable composition of claim 1, wherein said nanostructures of the first type comprise one of a metal material and a semiconductor material, and wherein said nanostructures of the second type comprise one of a dielectric and a material different than said nanostructures of the first type.

7. The printable composition of claim 1, wherein said elongate nanostructures generally have aspect ratios greater than about 3:1, wherein said compact nanostructures generally have aspect ratios less than about 2:1, and wherein a ratio by weight of said compact nanostructures to said elongate nanostructures in said printable composition is between about 0.2 and 100.

8. The printable composition of claim 7, wherein said molecular precursor, upon said printing and curing, forms decomposed precursor solids further filling said intermediate volumes.

9. The printable composition of claim 1, wherein said carrier solution facilitates transfer of the printable composition to the surface during said printing, wherein said nanostructures of the first and second types form between 3 percent and 90 percent of said printable composition by weight.

10. A method for fabricating a printed element, comprising: transferring a composition onto a surface according to a printing process; and curing the transferred composition to form the printed element; wherein said composition comprises a plurality of nanostructures of a first type, a plurality of nanostructures of a second type, and a molecular precursor in a carrier solution, wherein the plurality of nanostructures of the first type include elongate nanostructures and the plurality of nanostructures of the second type include compact nanostructures, the nanostructures of the second type at least partially filling space between said nanostructures of the first type in said printed element and wherein the molecular precursor facilitates in situ growth of crystalline or polycrystalline versions of the nanostructure of the first type upon transfer to a surface in conjunction with the carrier solution.

11. The method of claim 10, wherein said printing process comprises one or more of inkjet printing, drop-on-demand printing, screen printing, micro-contact printing, gravure printing, flexography printing, letterpress printing, and electrostatic printing.

12. The method of claim 10, wherein said nanostructures of the first type are elongate nanostructures, and wherein said nanostructures of the second type are compact nanostructures.

13. The method of claim 12, wherein said elongate nanostructures generally have aspect ratios greater than 3:1, and wherein said compact nanostructures generally have aspect ratios less than 2:1.

14. The method of claim 13, wherein said elongate nanostructures generally have aspect ratios greater than 5:1, and wherein said compact nanostructures are generally globular with a major dimension less than a minor dimension of said elongate nanostructures.

15. The method of claim 14, wherein said minor dimension of said elongate nanostructures is between about 2 nm and 100 nm.

16. The method of claim 12, wherein said elongate nanostructures and said compact nanostructures comprise an inorganic semiconductor material, and wherein the printed element is operable as a semiconductor circuit element having a carrier mobility greater than about 1 $cm^2N$-s.

17. The method of claim 16, wherein said inorganic semiconductor material comprises one of ZnO, OdS, OdSe, ZnS, PbS, GaAs, InP, InO, InSnO, and InZnO.

18. The method of claim 16, wherein said curing comprises sintering at a sintering temperature less than a melting temperature of said inorganic semiconductor material.

19. The method of claim 12, wherein said curing comprises sintering at a sintering temperature less than about 500° C.

20. An ink formulation for a printer, comprising: a first percentage by weight of elongate nanostructures having an aspect ratio above about 3:1, wherein said elongate nanostructures comprise a crystalline version of a compound; a second percentage by weight of compact nanostructures having an aspect ratio below about 2:1, wherein said second percentage is between about 0.2 and 100 times said first percentage; a carrier solution, wherein said elongate and compact nanostructures are suspended in said carrier solution; and a molecular precursor substantially dissolved in said carrier solution, said molecular precursor forming into a solid material interspersed with said elongate and compact nanostructures upon printing and curing of said ink formulation, wherein the molecular precursor facilitates in situ growth of crystalline or polycrystalline versions of the elongate nanostructure material upon transfer to a surface in conjunction with said carrier solution.

21. The ink formulation of claim 20, wherein said compound comprises one of ZnO, OdS, OdSe, ZnS, PbS, GaAs, InP, InO, InSnO, and InZnO.

22. The ink formulation of claim 20, wherein said compact nanostructures comprise one of a dielectric and said crystalline version of said compound.

23. The ink formulation of claim 20, said carrier solution comprising at least one of a solvent and a surfactant.

* * * * *